United States Patent [19]
Saitou

[11] Patent Number: 5,502,381
[45] Date of Patent: Mar. 26, 1996

[54] STRESS SENSOR USING MAGNETOSTRICTION THIN FILM

[75] Inventor: Shinji Saitou, Suita, Japan

[73] Assignee: Matsushita Electric Industrial Co., Ltd., Kadoma, Japan

[21] Appl. No.: 220,293

[22] Filed: Mar. 30, 1994

[30] Foreign Application Priority Data

Mar. 31, 1993 [JP] Japan .................................. 5-073199

[51] Int. Cl.⁶ ............................ G01B 7/24; G01R 33/18
[52] U.S. Cl. ............................................ 324/209; 73/779
[58] Field of Search ................................ 324/209; 73/779

[56] References Cited

U.S. PATENT DOCUMENTS 4,785,671  11/1988  Wakamiya et al. .................. 73/779

FOREIGN PATENT DOCUMENTS

| 63-182535 | 7/1988 | Japan . |
| 1023132 | 1/1989 | Japan . |
| 1-23132 | 1/1989 | Japan . |
| 1148928 | 6/1989 | Japan . |
| 4-99005 | 3/1992 | Japan . |

OTHER PUBLICATIONS

Hiroyuki Hase et al. "Oil Pressure Sensor Using Amorphous Magnetic Alloy," SAE Technical Paper Series, No. 920700 (1992).

Primary Examiner—Walter E. Snow
Attorney, Agent, or Firm—Willian Brinks Hofer Gilson & Lione

[57] ABSTRACT

A compact and solid-state mechanical sensor comprises a magnetic layer having magnetostriction and a planar coil for detecting a mechanical property as a change in impedance. The sensitivity of the sensor is improved with heat treatment to relax the internal stress in the magnetic layer. The magnetic layer 12a of 5 μm of thickness is formed on a titanium substrate 11 of 9.4 ppm/°C. thermal expansion coefficient. The magnetic layer comprises an Fe-based amorphous alloy film prepared with a sputtering method, and it has a composition of Fe 74, Cr 4, Si 13 and B 9 (at %), +22 ppm of saturation magnetostriction constant and 8.0 ppm/°C. of thermal expansion coefficient. An insulator layer 13a made of $SiO_x$ of 2 μm of thickness on the magnetic layer 12a, and a planar coil 14 and input/output terminals 15a, 15b made of aluminum of 2 μm of thickness is formed on the insulator layer 13a. The planar coil 14 is made of a linear conducting line having a form wherein a spiral coil is folded as a rectangular shape by 90°.

7 Claims, 8 Drawing Sheets

N° 5,502,381

STRESS SENSOR USING MAGNETOSTRICTION THIN FILM

BACKGROUND OF THE INVENTION

1. Field of the Invention

The present invention relates to a mechanical sensor for detecting a mechanical property.

2. Description of the Prior Art

Recently, it is required for electronic devices and instruments to have a more compact and thinner size. At present a mechanical sensor which uses a stress-magnetic effect is available practically and it comprises an amorphous magnetic alloy ribbon adhered on a cylinder. The alloy has a positive saturation magnetostriction constant, and a change in magnetic permeability of the ribbon due to applied stress is detected with a solenoid coil (refer for example SAE TECHNICAL PAPER SERIES 920700).

However, the above-mentioned prior art sensor uses a coil made of a wire wound like a solenoid and a bulk magnetic layer. Therefore, it is difficult to reduce the size of a mechanical sensor or to integrate it in a device. Further, because the thickness of the magnetic layer is as large as 20–30 µm and the diameter of the wire is as large as 20–30 µm, it has an upper limit to be used at higher frequencies.

A strain gauge is used as a planar mechanical sensor. However, its sensitivity is as low as $10^{-3}$ of that of a sensor using of stress-magnetic effect.

SUMMARY OF THE INVENTION

An object of the present invention is to provide a mechanical sensor having a high sensitivity.

Another object of the present invention is to provide a compact mechanical sensor which can be integrated easily in a device.

A mechanical sensor according to the present invention comprises a coil made of an electrically conductive film formed on a substrate, and a magnetic layer which can be magnetized by the coil, at least a part of the magnetic layer having magnetostriction. A stress generated in the magnetic layer having magnetostriction is detected as a change of impedance. Thus, a mechanical sensor is made compact and can be integrated in a device. Further, the sensitivity thereof can be enhanced with heat treatment of the magnetic layer because soft magnetic properties can be enhanced with heat treatment due to decrease in internal stress. A thermal stress $\sigma_b$ generated in the magnetic layer due to the heat treatment is proportional to $\Delta T \times (\alpha_f - \alpha_s)$, wherein $\Delta T$ denotes a difference between ambient temperature and heat treatment temperature. Thus, in order to make heat treatment effective, it is required to decrease internal stress that a thermal expansion coefficient $\alpha_s$ of the substrate and a thermal expansion coefficient $\alpha_f$ of the magnetic layer hold a relation that $\sigma > \sigma_b$ if $\sigma > 0$ (tensile stress) and $\sigma < \sigma_b$ if $\sigma < 0$ (compressive stress), wherein $\sigma$ denotes an internal stress in the as-grown magnetic layer.

An advantage of a mechanical sensor according to the present invention is that the sensitivity of a mechanical sensor can be improved.

Another advantage of a mechanical sensor according to the present invention is that it can be made more compact and can be integrated in a device.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
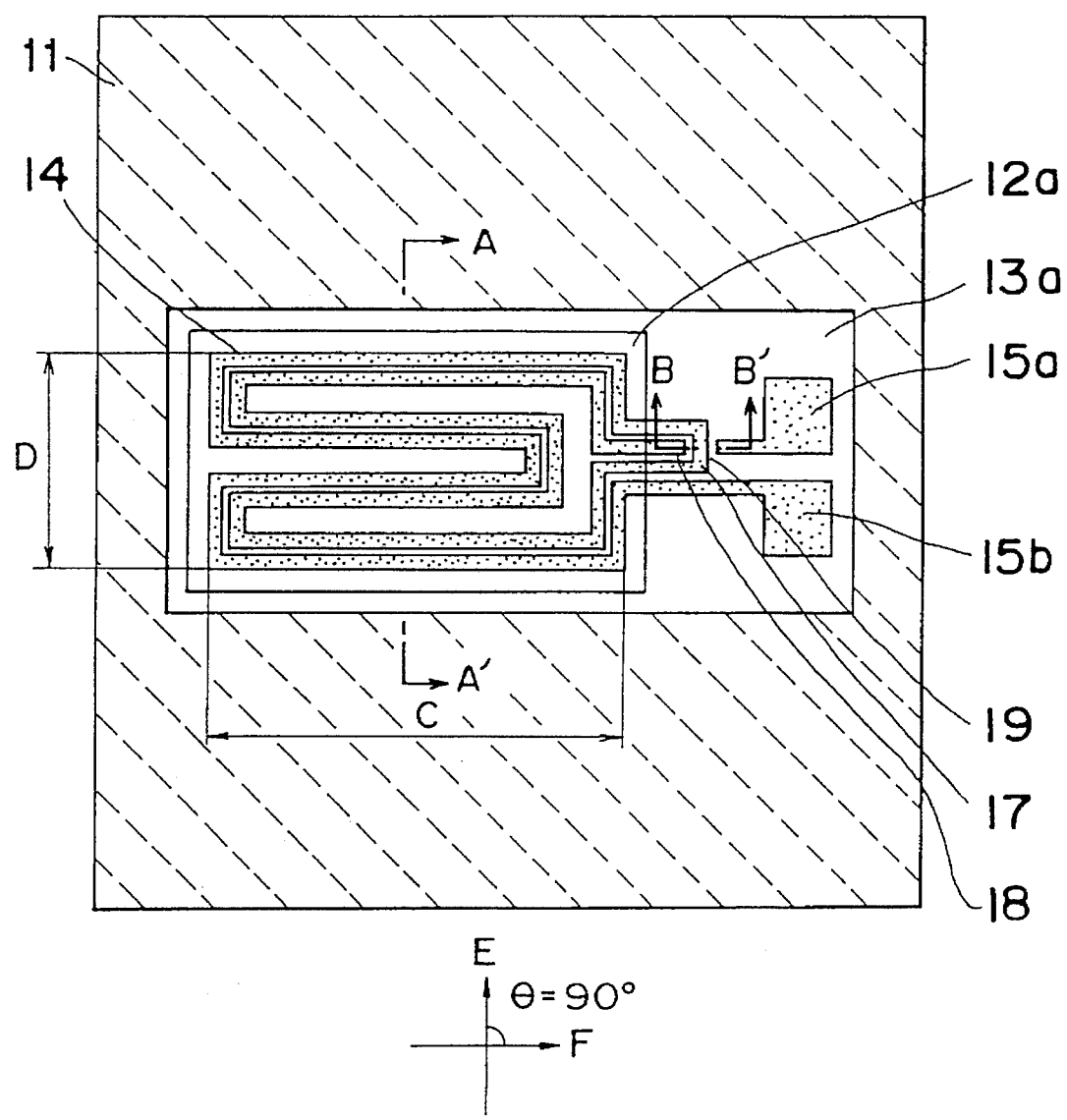
FIG. 1 is a plan view of a mechanical sensor of a first embodiment of the present invention.

Embodiments of the present invention will be explained below with reference to the drawings, wherein like reference characters designate like or corresponding parts throughout the drawings. Tensile stress is denoted as plus (+) and compressive stress is denoted as minus (–). A thermal expansion coefficient represents an average between room temperature (25° C.) and 300° C.

Figure 2:
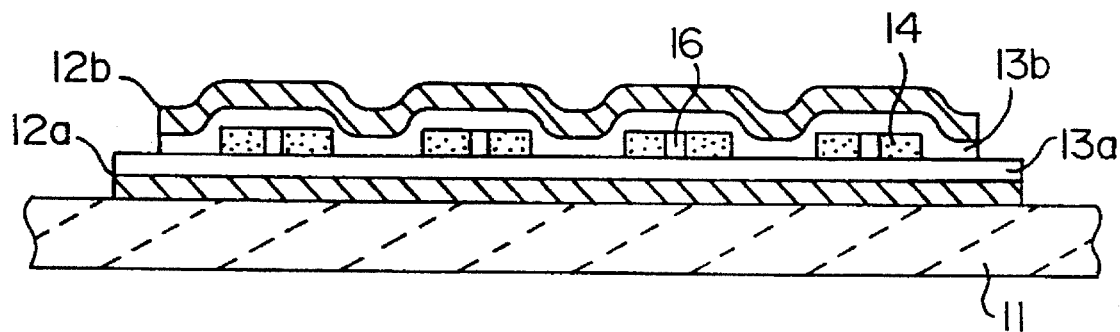
FIG. 2 is a sectional view of the sensor along A–A' line in FIG. 1.
Figure 3:
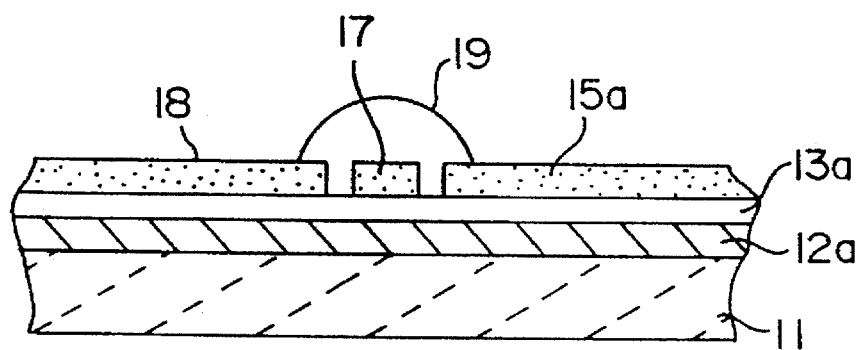
FIG. 3 is a sectional view of the sensor along B–B' line in FIG. 1.

FIG. 1 shows a schematic plan view of a mechanical sensor of a first embodiment of the present invention, while FIGS. 2 and 3 show sectional views along A–A' line and along B–B' line in FIG. 1, respectively. A structure of the mechanical sensor is explained with reference to FIGS. 1, 2 and 3.

A substrate 11 of 30 mm length, 14 mm width and 0.5 mm thickness is provided (it is to be noted that FIG. 1 is not shown in a same scale along the horizontal and vertical directions). The substrate 11 is made from each of following three kinds of materials in order to observe changes in properties due to thermal expansion coefficient: phosphor bronze ($\alpha_s = 17$ ppm/°C.), titanium ($\alpha_s = 9.4$ ppm/°C.) and silicon ($\alpha_s = 3.0$ ppm/°C.). As to titanium and phosphor bronze, heat treatment at 400° C. is adopted in order to remove strain generated on cutting, rolling and the like.

A first magnetic layer 12a of 5 µm thickness is formed on the substrate 11 with a sputtering method. The first magnetic layer 12a is made of an Fe-based amorphous alloy film of a composition of Fe 74, Cr 4, Si 13 and B 9 (at %), and its saturation magnetostriction constant is +22 ppm and its $\alpha_f$ is 9.0 ppm/°C.

A first insulator layer 13a of $SiO_x$ of 2 µm thickness is formed on the magnetic layer 12a with a sputtering method. Next, a planar coil 14 and input/output terminals 15a and 15b made of aluminum films are formed on the first insulator layer 13a. The planar coil 14 is made of aluminum because of two reasons. One reason is that the close adherence with the insulator layer 13a made of the oxide. That is, because aluminum forms a dense intermediate layer at an interface with the oxide, the adherence thereof is good. The adherence is very important for a mechanical sensor because it operates under stress. Though copper, aluminum and the like are available as electrically conducting materials, they have bad adherence with the oxide, and a layer for improving adherence made of chromium or the like is further needed. Thus, a manufacturing step of the electrically conducting layer becomes complicated. The second reason is that aluminum can be used for wire bonding and that it is cheaper than gold which can also be used for wire bonding. Chromium also has good adherence property with the oxide similarly to aluminum. Then, it is preferable that chromium is included as a constituent element in the first magnetic layer 12a in order to improve adherence.

The planar coil 14 comprises a linear, electrically conductive line having a shape of a spiral coil of two turns like a rectangular shape bent by 90° successively, as shown in FIG. 1. The spiral coil is adopted in order to increase inductance. In the present invention, the number of turns of the coil is two. The size of an outer peripheral of the coil 14 is 3000 μm of length C of and 820 μm of width D. The line width of the conducting line of the coil 14 is 50 μm, while a distance between adjacent conducting lines flowing a current in the same directions is 10 μm and a distance between lines flowing a current in opposite directions is 180 μm.

The outer end of the spiral coil of two turns is connected to one 15b of the input/output electrodes, while the other 15a of the electrodes which has to be connected to an inner end 18 of the spiral coil is formed isolated from the planar coil 14. The planar coil 14 has a portion 17 extruding toward the electrode 15a for connecting the inner end 18 of the spiral coil to the electrode 15b. Then, the inner end 18 located inside the extruding portion 17 is connected with a wire 19 to the input/output terminal 15a with a wire bonding technique. An insulator layer 16 of a same thickness as that of the conductive line is formed between adjacent lines flowing a current in the same direction.

Further, as shown in FIG. 2, a second insulator layer 13b (not shown in FIG. 1) of same material, thickness and manufacturing process as the first insulator layer 13a to cover the spiral portion of the planar coil 14. Then, a second magnetic layer 12b of same material, thickness and manufacturing process as the first magnetic layer 12a are formed on the second insulator layer 13b. Thus, the coil 14 is sandwiched by the two magnetic layers 12a and 12b. In FIG. 1, only a contour of the second magnetic layer 12b is shown for displaying the coil 14 clearly. It is also preferable that chromium is included as a constituent element in the second magnetic layer 12b in order to improve adherence with the oxide layer 13b.

In the structure of the embodiment, as explained above, the protruding portion 17 is provided and the inner end 18 is connected to the input/output terminal 15a with the wire 19. Therefore, it is an advantage that a photolithography process is used once and manufacturing steps of a coil become simple.

Next, an operation of the mechanical sensor is explained. If a stress is applied to the magnetic layers 12a, 12b having magnetostriction, a magnetic permeability or a tendency magnetized by stress in a stress direction changes due to magnetic elastic energy. Because a change in magnetic permeability due to stress is detected by measuring a change of inductance, it is desirable that the magnetization direction agrees with the stress direction as well as possible. A force is applied to generate a stress on the surface of the substrate, and a change of a mechanical property due to the stress is measured. That is, the magnetic layer 12a is magnetized by flowing a current in the coil 14 through the terminals 15a, 15b with an external current source (not shown), and a stress is detected as a change in impedance through the terminals 15a, 15b.

The arrangement of the coil 14 is described. In FIG. 1, a longitudinal direction in a plane of the substrate 11 is denoted as direction E and a longitudinal direction in a plane of the planar coil 14 is denoted as direction F. As shown in FIG. 2, the planar coil 14 formed over the substrate comprises a flat conducting line and it is parallel to the magnetic layers 12a and 12b, so that the magnetization direction lies in the magnetic layers and perpendicular to the conducting line. Further, because a stress applied to the magnetic layers is equivalent to the stress applied to the substrate, when a stress is applied to the substrate, it is regarded to be applied to the magnetic layers. Therefore, the planar coil 14 is arranged so that the direction E of the coil 14 becomes perpendicular to the direction F of the stress. Further, by bending the electrically conducting line like a rectangular shape, the coil 14 has a layout having portions of long lengths along the same direction (direction F).

Figure 4:
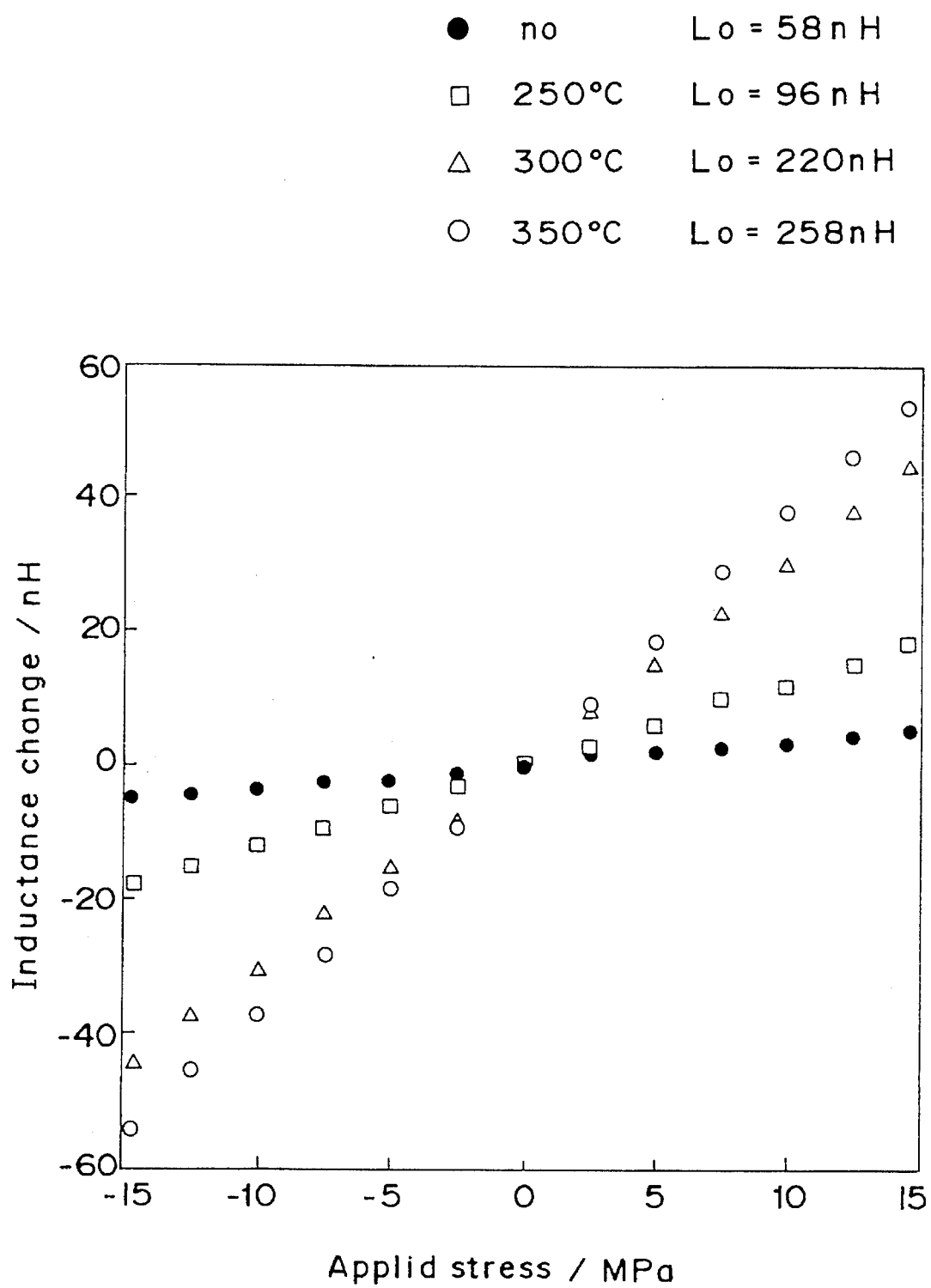
FIG. 4 is a graph of inductance plotted against stress of a sample with use of a silicon substrate in the first embodiment.
Figure 5:
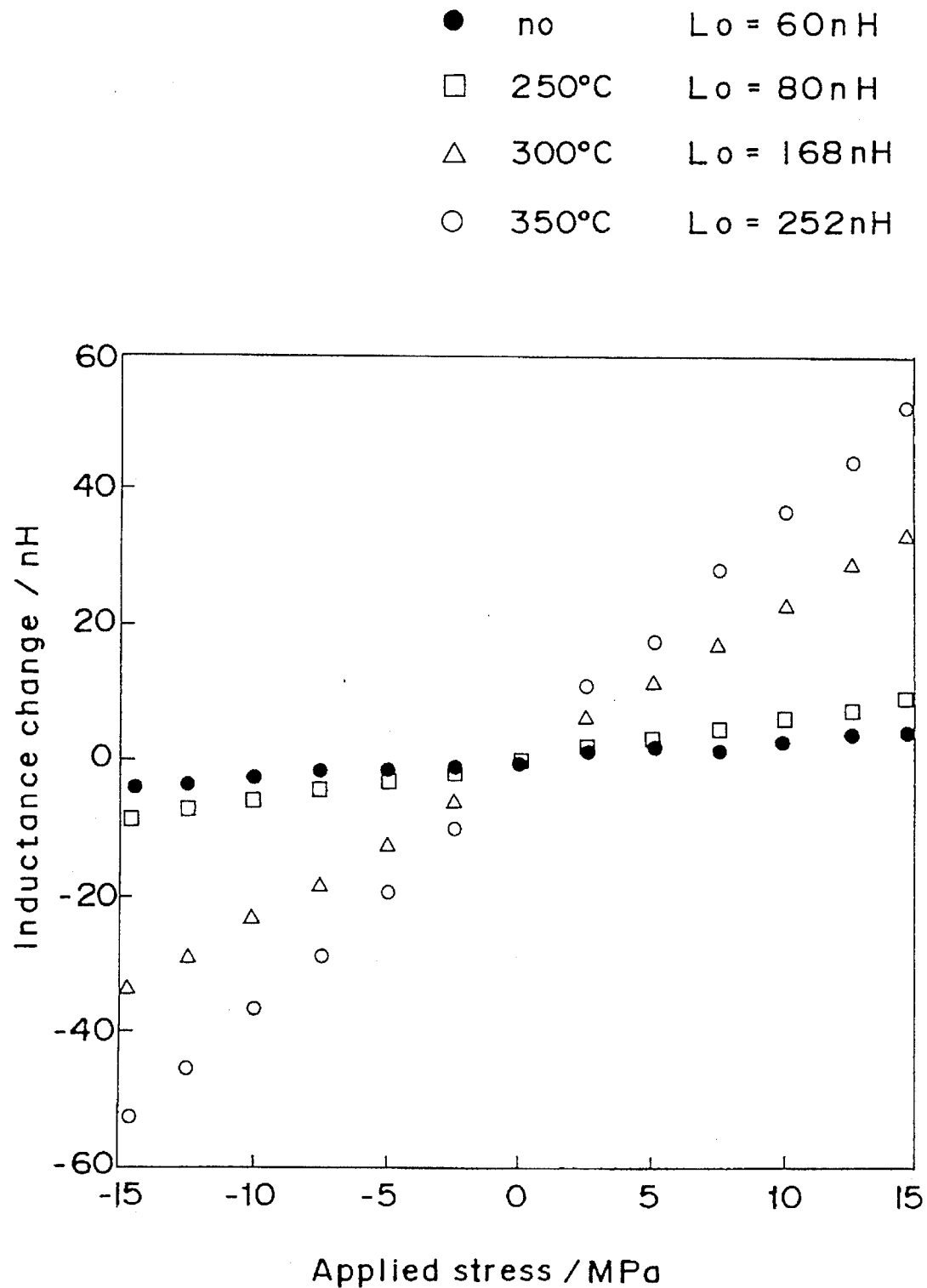
FIG. 5 is a graph of inductance plotted against stress of a sample with use of a titanium substrate in the first embodiment.
Figure 6:
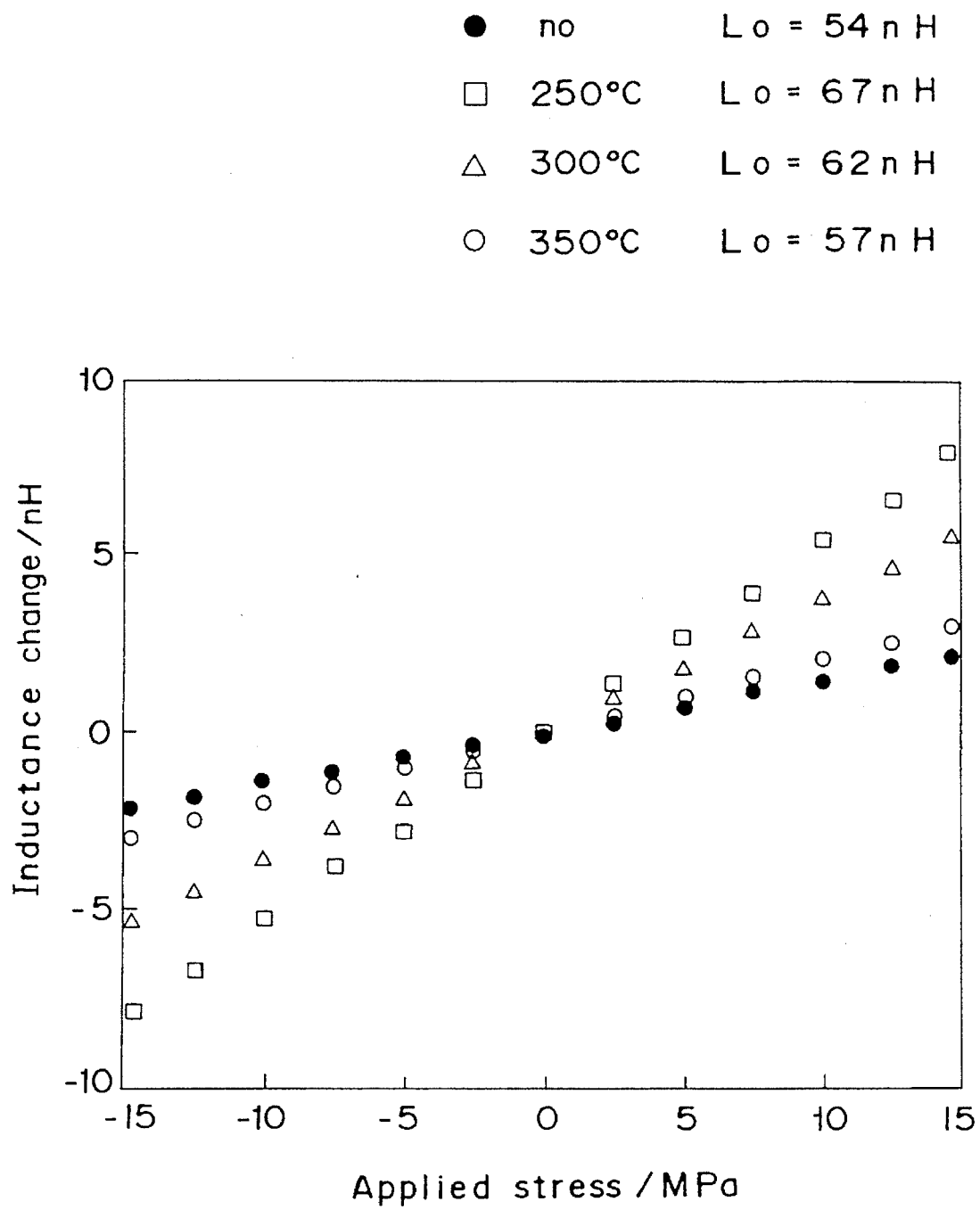
FIG. 6 is a graph of inductance plotted against stress of a sample with use of a phosphor bronze substrate in the first embodiment.

Next, improvement of sensor characteristics due to heat treatment is described. FIGS. 4, 5 and 6 show inductance change plotted against applied stress of samples formed on a silicon substrate, on a titanium substrate and on a phosphor bronze substrate, respectively. An inductance under no applied stress is denoted as $L_0$. The magnetic layers in the samples are subjected to heat treatment at 250°, 300° and 350° C. The sample used without heat treatment is denoted as "no" in FIGS. 4–6. Though inductance measured at 1 MHz is shown, there is no change due to frequency between 1–10 MHz.

As illustrated in FIGS. 4–6, inductance change or sensitivity due to stress is small for all the samples having as-grown magnetic layers. A magnetic film grown with a physical vapor deposition process (PVD) or a chemical vapor deposition process (CVD) has an internal stress (hereinafter referred to as σ of a few hundred MPa caused by two factors. One factor is a thermal stress (hereinafter referred to as $\sigma_a$) caused by a difference of thermal expansion between the film and the substrate, while the other is an intrinsic stress (hereinafter referred to as $\sigma_i$) generated due to deposition process itself. In the present embodiment, because the substrate is cooled with water on deposition process, thermal stress $\sigma_a$ is negligibly small, and internal stress σ is considered to be nearly equal to intrinsic stress $\sigma_i$. In the magnetic layers 12a, 12b in the present embodiment, compressive intrinsic stress $\sigma_i$ of −400 MPa is observed in a measurement with a cantilever method.

On the other hand, FIGS. 4 and 5 show that as heat treatment temperature increases as high as 300° C., the sensitivity and inductance change of samples formed on the silicon and titanium substrates are improved sharply. It is considered that a stress in the as-grown layers is relaxed due to heat treatment to increase magnetic permeability. On the other hand, as shown in FIG. 6, though heat treatment at 250° C. for samples formed on the phosphorus bronze substrate improves sensitivity somewhat, the sensitivity decreases for higher heat treatment temperatures.

Because a mechanical sensor according to the present embodiment includes magnetic layers having magnetostriction, if soft magnetic characteristics of the magnetic layers deteriorate, this decreases magnetic permeability due to the existence of internal stress σ. The magnetic permeability can be increased largely by relaxing intrinsic stress $\sigma_i$ in the as-grown magnetic layers by heat treatment. However, heat treatment itself generates a thermal stress (hereinafter referred to as $\sigma_b$ in order to discriminate it from thermal stress $\sigma_b$ on film deposition). Because an internal stress after heat treatment is a sum of an intrinsic stress $\sigma_i$ in the magnetic layer and the thermal stress $\sigma_b$. Though heat treatment relaxes internal stress, if the total internal stress is not decreased due to generation of the thermal stress $\sigma_b$, than a value before heat treatment, the heat treatment is not effective to improve sensitivity. Then, if the intrinsic stress $\sigma_i$ is decreased with heat treatment, it is required that a thermal stress $\sigma_b$ tends to relax intrinsic stress $\sigma_i$. Even if a thermal stress $\sigma_b$ does not tend to relax intrinsic stress $\sigma_i$, it is required that the thermal expansion coefficient $\sigma_s$ of the substrate is of the same order as $\sigma_f$ of the magnetic layers and that the thermal stress $\sigma_b$ is much smaller than the intrinsic stress $\sigma_i$.

A thermal stress $\sigma_b$ is proportional to a difference in thermal expansion coefficient $(\alpha_f - \alpha_s)$ and it is expressed as follows:

$$\sigma_b = Y \times \Delta T \times (\alpha_f - \alpha_s)/(1-\gamma), \quad (1)$$

wherein Y denotes Young's modulus ($12 \times 10^{10}$ Pa), $\Delta T$ denotes a difference between room temperature (25° C.) and heat treatment temperature and $\gamma$ denotes a Poisson ratio 0.3 of the magnetic layers. A compressive stress ($\sigma_b < 0$) exists if $\alpha_f < \alpha_s$, while a tensile stress ($\sigma_b < 0$) exists if $\alpha_f > \alpha_s$. Then, this equation shows that if $\alpha_f = \alpha_s$ or $\alpha_f > \alpha_s$, the sensitivity can be improved largely. Actually, for a titanium substrate having a thermal expansion coefficient $\alpha_s$ of about the same order as $\alpha_f$ and for a silicon substrate having $\alpha_f$ larger than $\alpha_s$, the sensitivity or the inductance change is found to be enhanced largely.

Figure 7:
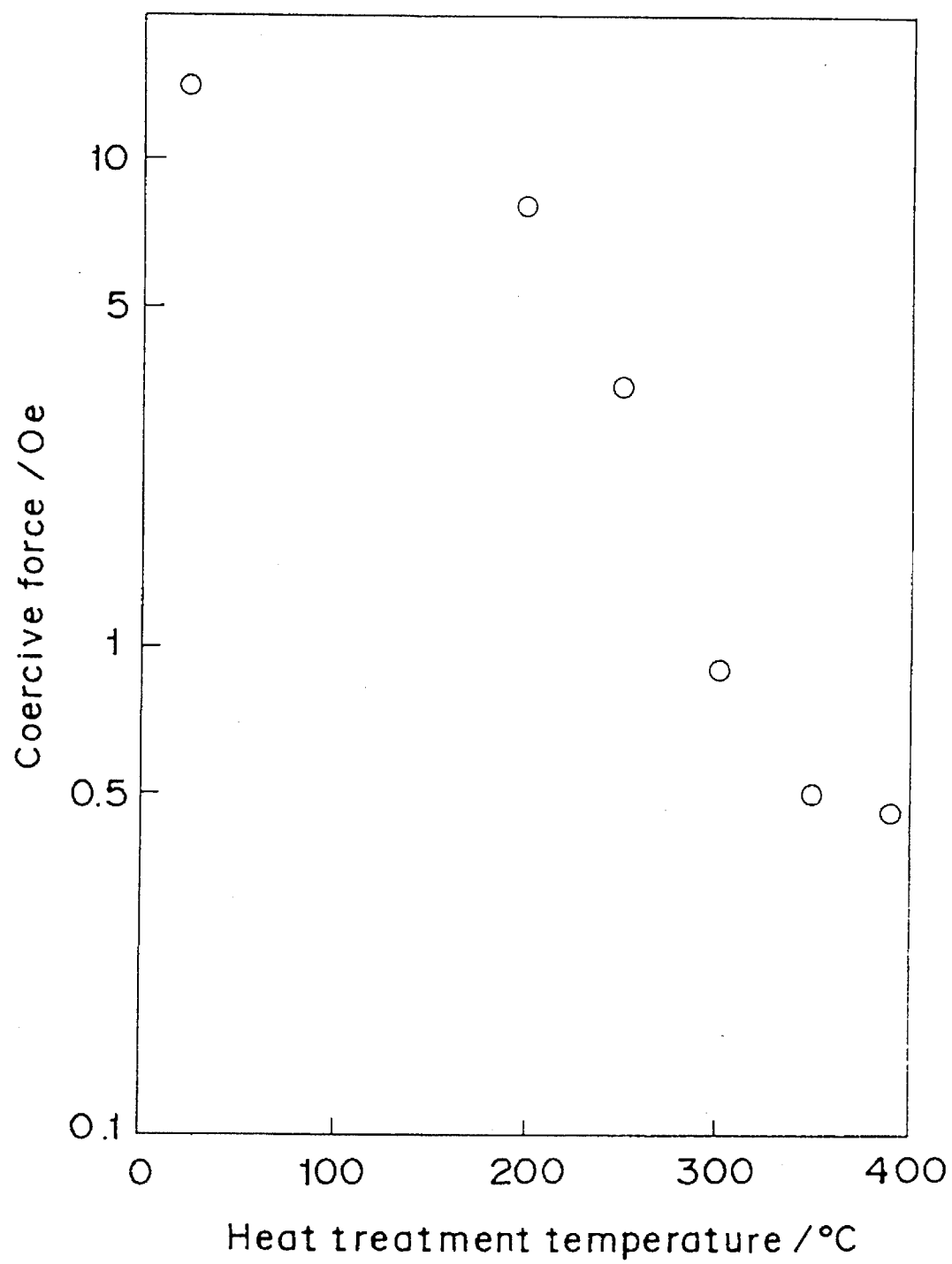
FIG. 7 is a graph of a change due to heat treatment of coercive force of a magnetic layer formed on a glass substrate.
Figure 8:
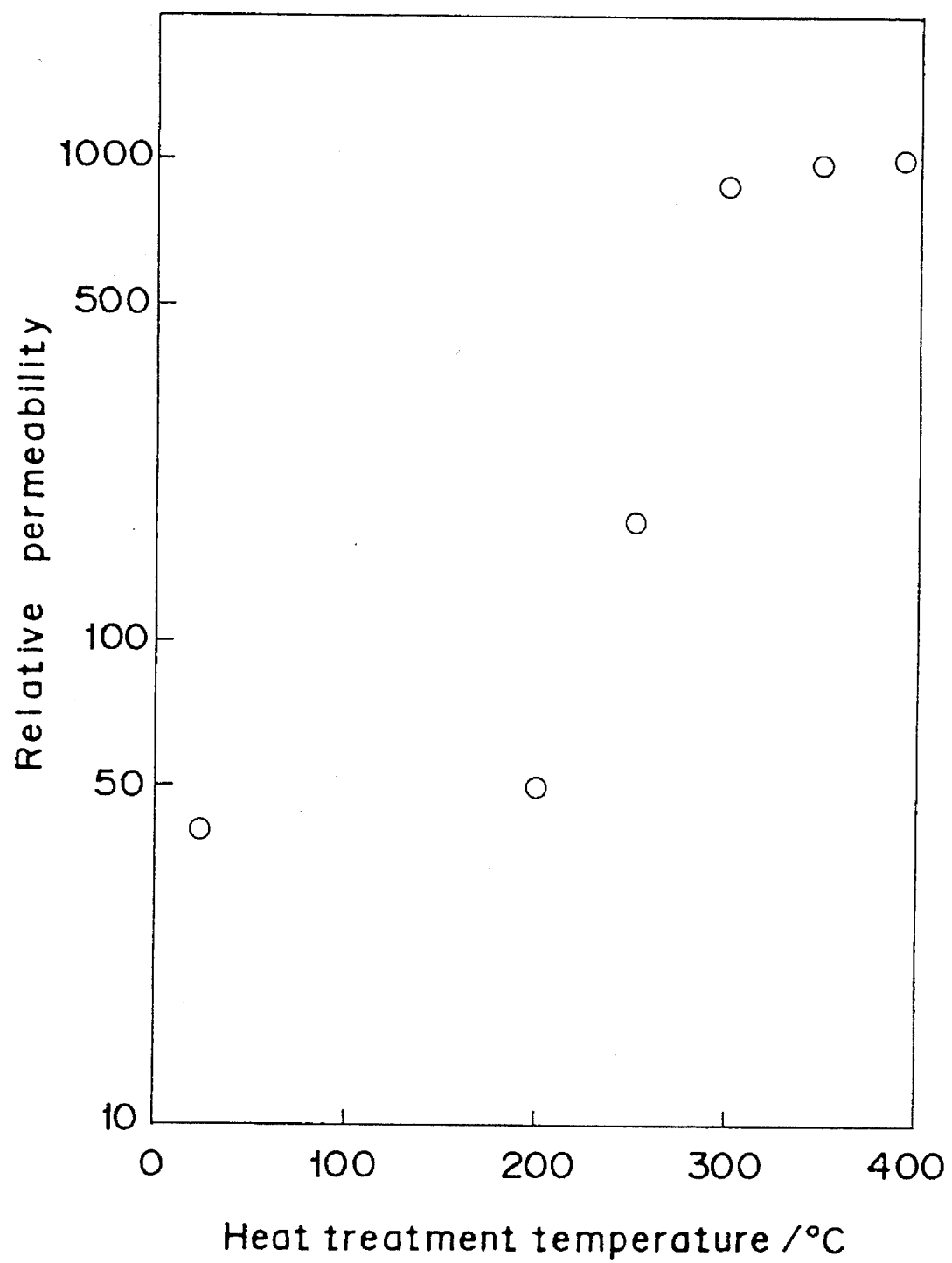
FIG. 8 is a graph of a change of relative magnetic permeability of a magnetic layer formed on a glass substrate due to heat treatment.
Figure 9:
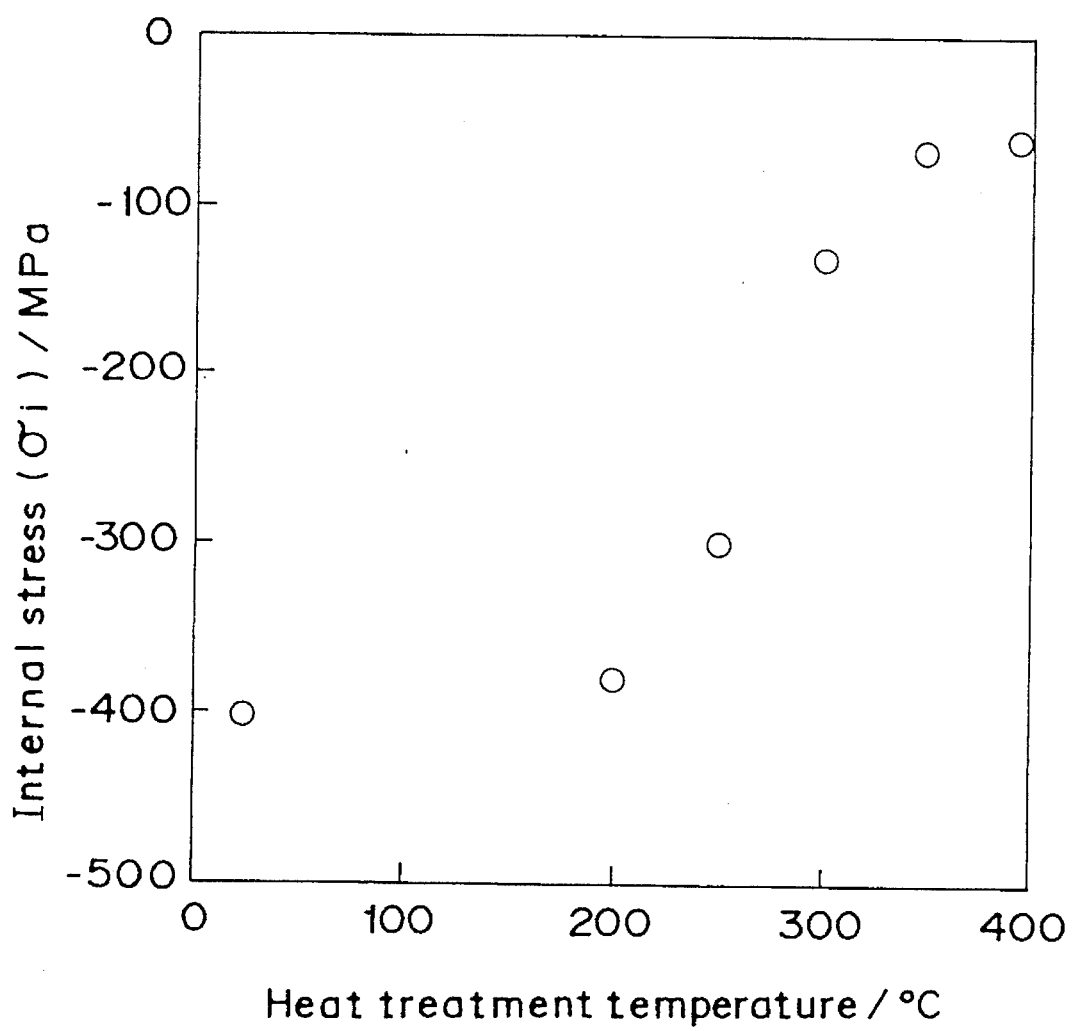
FIG. 9 is a graph of a change due to heat treatment of internal stress ($\sigma_i$) of a magnetic layer formed on a glass substrate.

Magnetic layers similar to those 12a, 12b are formed on a glass substrate (Model No. 100 of Matsunami Glass, $\alpha_s = 7.7$ ppm/°C.) having a thermal expansion coefficient of about the same as that of the magnetic layers, and the effects of heat treatment on magnetic characteristics and σ are observed. Because the thermal expansion coefficients thereof are about the same each other, internal stress σ measured with a cantilever method is considered to be nearly equal to intrinsic stress $\sigma_i$. As shown in FIGS. 7 and 8, coercive force and magnetic permeability change largely at heat treatment temperature of about 300° C., or soft magnetic characteristics are improved. Further, as shown in FIG. 9, intrinsic stress $\sigma_i$ also decreases to about a sixth of the initial value. Therefore, it is considered that atomic migration becomes active at about 300° C. and the relaxation effect of intrinsic stress $\sigma_i$ due to heat treatment becomes obvious.

As explained above, if a thermal stress $\sigma_b$ does not tend to relax intrinsic stress $\alpha_i$, it is required that the thermal expansion coefficient $\sigma_s$ of the substrate is of the same order as $\sigma_f$ of the magnetic layers and that the thermal stress $\sigma_b$ is much smaller than the intrinsic stress $\sigma_i$. Then, it is estimated how close $\alpha_f$ has to be to $\alpha_s$ for the abovementioned condition of $\alpha_f = \alpha_s$. Thermal stress $\sigma_b$ at 250°– 350° C. is calculated for particular substrates: 193–278 MPa for a silicon substrate, −54—78 MPa for a titanium substrate and −340—510 MPa for a phosphor bronze substrate. If these values are compared with intrinsic stress $\sigma_i$ shown in FIG. 9, it is found that thermal stress $\sigma_b$ is about the same as intrinsic stress $\sigma_i$ after heat treatment for a titanium substrate which improves sensitivity largely, whereas thermal stress $\sigma_b$ at 300° C. or more is larger than intrinsic stress $\sigma_i$ in the as-grown state for a phosphor bronze substrate which improves sensitivity at 250° C. only somewhat. For a silicon substrate, thermal stress $\sigma_b$ tends to relax intrinsic stress $\sigma_i$ to relax local stress and it is considered that soft magnetic characteristics and sensitivity are improved even if thermal stress $\sigma_b$ is about a half of the intrinsic stress $\sigma_i$ before heat treatment. Usually, an internal stress of a few hundreds MPa exists in the magnetic layers when a film is grown with a gas vapor deposition process or with a liquid deposition process. When characteristics of the magnetic layers prepared with such a process are improved by heat treatment, the above-mentioned results show that even if heat treatment does not relax intrinsic stress $\sigma_i$, inductance and sensitivity can be improved by a few times for a film with thermal stress $\sigma_b$ of 100 MPa or less. Heat treatment begins to become effective at about 300° C. A difference in thermal expansion coefficient which satisfies this condition can be estimated from Eq. (1) to be 2.12 ppm/°C. Therefore, magnetic layers and a substrate suitable for a mechanical sensor according to the present invention satisfy a condition that $$\sigma_s - \alpha_f \leq 2 \text{ ppm/°C}.$$

In the above-mentioned embodiment, a compressive stress exists in the magnetic layer. On the other hand, if a tensile stress exists, it is understood that the inequality condition is reversed as follows:

$$\sigma_s - \alpha_f \geq -2 \text{ ppm/°C}.$$

For both compressive and tensile stress, it is better that $\sigma_s$ is equal to $\sigma_f$ as well as possible as to the temperature characteristic of the sensor.

As explained above, it can be said that a titanium substrate is most appropriate for magnetic layers of the present embodiment. Because a thermal expansion coefficient of a magnetic material having a few tens ppm is usually 12 ppm/°C. or less, a titanium substrate will also be effective for other magnetic layers having magnetostriction.

Further, titanium has other properties suitable for a mechanical sensor according to the present invention. First, because titanium is a metal, it is harder to be broken than a silicon or glass substrate. Second, titanium also has good mechanical properties as a spring material as phosphor bronze. Third, because titanium is not an alloy, but a single element, mechanical properties such as Young's modulus and thermal expansion coefficient have nearly no scatterings and can be produced stably. Fourth, because titanium has a large resistivity though it is a pure metal, eddy current loss is small when driven at high frequencies. Therefore, a titanium substrate is most appropriate for a mechanical sensor according to the present invention.

As explained above, a mechanical sensor according to the present invention comprises a planar coil formed on a substrate, and a magnetic layer which can be magnetized by the coil, at least a part of the magnetic layer having magnetostriction. Then, a mechanical sensor can be made more compact and can be integrated in a device. A stress generated in the magnetic layer having magnetostriction is detected as a change of impedance. A stress generated in the magnetic layer in the manufacturing process can be decreased by heat treatment, and heat treatment can enhance the sensitivity of the sensor by selecting thermal expansion coefficients of the magnetic layer and the substrate.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A mechanical sensor comprising:

a substrate;

an electrically conducting coil formed on the substrate, which coil being connected to two terminals; and a first magnetic layer which can be magnetized by the coil, at least a part of the first magnetic layer having magnetostriction, the first magnetic layer having been subjected to heat treatment of an as-grown first magnetic layer, whereby a stress generated in the first magnetic layer being detected as a change in impedance by using the coil;

wherein a thermal expansion coefficient $\alpha_s$ of the substrate and a thermal expansion coefficient $\alpha_f$ of the first magnetic layer hold a relation that $\sigma > \sigma_b$ if $\sigma > 0$ and $\sigma < \sigma_b$ if $\sigma < 0$, wherein $\sigma$ denotes an internal stress in the as-grown first magnetic layer, $\sigma_b$ denotes an internal stress generated in the magnetic layer due to the heat treatment, which $\sigma_b$ being proportional to $\Delta T \times (\alpha_f - \alpha_s)$, wherein $\Delta T$ denotes a difference between ambient temperature and heat treatment temperature.

2. The mechanical sensor according to claim 1, wherein the first magnetic layer has an intrinsic stress when formed with gas phase film deposition process or liquid phase film deposition process.

3. The mechanical sensor according to claim 1, wherein the internal stress in said first magnetic layer in an as-grown state satisfies a relation $\alpha_s - \alpha_f \leq 2$ ppm/°C. for compressive stress and a relation $\alpha_s - \alpha_f \geq -2$ ppm/°C. for tensile stress between thermal expansion coefficient $\alpha_s$ of said substrate and thermal expansion coefficient $\alpha_f$ of said magnetic layer.

4. The mechanical sensor according to claim 1, further comprising a second magnetic layer arranged to interpose said coil with said first magnetic layer, which second magnetic layer can be magnetized by said coil, at least a part of the second magnetic layer having magnetostriction.

5. The mechanical sensor according to claim 1, wherein said substrate is made of titanium.

6. The mechanical sensor according to claim 1, further comprising an oxide insulator layer formed between said coil and said first magnetic layer, wherein said first magnetic layer includes chromium as a constituent element.

7. The mechanical sensor according to claim 1, further comprising an oxide insulator layer formed between said coil and said first magnetic layer, wherein said coil is made of aluminum.

* * * * *